United States Patent
Lin et al.

(10) Patent No.: US 11,742,309 B2
(45) Date of Patent: Aug. 29, 2023

(54) BUMP COPLANARITY FOR SEMICONDUCTOR DEVICE ASSEMBLY AND METHODS OF MANUFACTURING THE SAME

(71) Applicant: Micron Technology, Inc., Boise, ID (US)

(72) Inventors: Ko Han Lin, Taichung (TW); Tsung Che Tsai, Tainan (TW)

(73) Assignee: Micron Technology, Inc., Boise, ID (US)

( * ) Notice: Subject to any disclaimer, the term of this patent is extended or adjusted under 35 U.S.C. 154(b) by 350 days.

(21) Appl. No.: 17/000,176

(22) Filed: Aug. 21, 2020

(65) Prior Publication Data
US 2022/0059485 A1 Feb. 24, 2022

(51) Int. Cl.
*H01L 23/00* (2006.01)

(52) U.S. Cl.
CPC .............. *H01L 24/14* (2013.01); *H01L 24/03* (2013.01); *H01L 24/06* (2013.01); *H01L 24/11* (2013.01); *H01L 2224/0362* (2013.01); *H01L 2224/0391* (2013.01); *H01L 2224/0401* (2013.01); *H01L 2224/06102* (2013.01); *H01L 2224/1403* (2013.01)

(58) Field of Classification Search
CPC ...................................................... H01L 24/14
See application file for complete search history.

(56) References Cited

U.S. PATENT DOCUMENTS

| | | | | |
|---|---|---|---|---|
| 4,904,608 | A * | 2/1990 | Gentner | H01L 31/105 438/94 |
| 2002/0111009 | A1* | 8/2002 | Huang | H01L 24/05 257/E23.021 |
| 2003/0076209 | A1* | 4/2003 | Tsai | H01L 27/08 336/200 |
| 2006/0024942 | A1* | 2/2006 | Aiton | H01L 24/05 257/E21.508 |
| 2012/0032322 | A1* | 2/2012 | Lin | H01L 24/16 257/737 |
| 2013/0147033 | A1* | 6/2013 | Chen | H01L 23/522 257/737 |
| 2014/0001635 | A1* | 1/2014 | Chen | H01L 23/5223 257/774 |
| 2016/0307862 | A1* | 10/2016 | Lin | H01L 25/50 |
| 2019/0326245 | A1* | 10/2019 | Baello | H01L 24/09 |

* cited by examiner

*Primary Examiner* — William A Harriston
(74) *Attorney, Agent, or Firm* — Perkins Coie LLP (57) ABSTRACT

Improved bump coplanarity for semiconductor device assemblies, and associated methods and systems are disclosed. In one embodiment, when openings in a passivation layer of a semiconductor device are formed to expose surfaces of bond pads, additional openings may also be formed in the passivation layer. The additional openings may have depths shallower than the openings extending to the surfaces of bond pads by leveraging partial exposures to the passivation layer using a leaky chrome process. Subsequently, when active bumps (pillars) are formed on the exposed surfaces of bond pads, dummy bumps (pillars) may be formed on recessed surfaces of the additional openings such that differences in heights above the surface of the passivation between the active bumps and the dummy bumps are reduced to improve coplanarity.

20 Claims, 7 Drawing Sheets

BUMP COPLANARITY FOR SEMICONDUCTOR DEVICE ASSEMBLY AND METHODS OF MANUFACTURING THE SAME

TECHNICAL FIELD

The present disclosure generally relates to semiconductor device assemblies, and more particularly relates to improved bump coplanarity for semiconductor device assemblies.

BACKGROUND

Semiconductor packages typically include a semiconductor die (e.g., memory chip, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, direct chip attach methods (e.g., flip-chip bonding between the semiconductor die and the substrate) may be used to reduce the footprint of the semiconductor packages. Such direct chip attach methods may include directly connecting multiple conductive pillars (or bumps) of the semiconductor die to corresponding conductive structures of the substrate. Further, a solder structure may be formed over individual conductive pillars (or bumps) to facilitate bonding between the conductive pillars and the corresponding conductive structures—e.g., forming joints. If the conductive pillars have different heights, conductive pillars that are too short may not be connected to corresponding conductive structures resulting in "opens" (which may be referred to as non-joints), while conductive pillars that are too tall may be crushed against corresponding conductive structures to result in "smashed" joints.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments directed to bumps (or pillars) with improved coplanarity for semiconductor device assemblies, and associated systems and methods are described below. Semiconductor devices or dies (e.g., memory devices) may include electrically conductive bumps that are attached to bond pads to carry signals in and/or out of active components (e.g., various functional features and/or circuits) of the semiconductor devices. Such bumps (pillars) may be referred to as active bumps (active pillars). The semiconductor devices may also include dummy bumps (dummy pillars) to provide structural supports for the semiconductor devices during assembly process steps (e.g., a flip-chip bonding process). The dummy bumps may be electrically floating (e.g., isolated from the active components of the semiconductor devices), or may be connected to a ground node of the semiconductor devices.

As described in more detail below, the active bumps coupled to the bond pads may be recessed with respect to the dummy bumps that are typically disposed on a surface of a passivation layer over the bond pads. Accordingly, during the flip-chip bonding process, as the active bumps form joints (e.g., interconnects) with corresponding conductive structures of another semiconductor device (or a package substrate), the dummy bumps may result in smashed joints and their structural integrity may be compromised. Further, the smashed joints may touch one or more neighboring joints (e.g., joints including the active bumps) resulting in unwanted electrical shorts. If the flip-chip bonding process is targeted for the dummy bumps to form joints without resulting in smashed joints, the active bumps may suffer from non-joints (e.g., opens).

Several embodiments of the present technology are directed to utilizing a process to generate recessed regions in passivation layers of semiconductor devices such that the dummy bumps can be formed on the recessed regions. In this manner, the dummy bumps and the active bumps can have heights above the passivation layer within a predetermined range acceptable for direct chip attach methods (e.g., a flip-chip bonding process). The predetermined range may be devised to allow certain variations in the heights among the bumps, which may not result in yield and/or reliability issues after the flip-chip bonding process—e.g., due to the smashed joints and/or non-joints.

The process may utilize a mask that includes one or more regions configured to allow partial exposures of an underlying layer to the electromagnetic energy of a light used during a photolithography process step, which may be referred to as a leaky-chrome process. The partially exposed underlying layer may exhibit an intermediate behavior (e.g., an intermediate etch rate) when compared to the regions that has no exposure or a full exposure. In this manner, the process (e.g., the leaky-chrome process) may create the recessed regions without incurring additional processing steps (e.g., additional photolithography step and associated etch and/or clean steps for separately generating the recessed regions), and thereby reducing height differences between the active bumps and the dummy bumps to improve the coplanarity.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 2 through 5.

As used herein, the terms "vertical," "lateral," "down," "up," "upper," and "lower" can refer to relative directions or positions of features in the semiconductor device assemblies in view of the orientation shown in the FIG. s. For example, "upper" or "uppermost" can refer to a feature positioned closer to the top of a page than another feature. These terms, however, should be construed broadly to include semiconductor devices having other orientations.

Figure 1A:
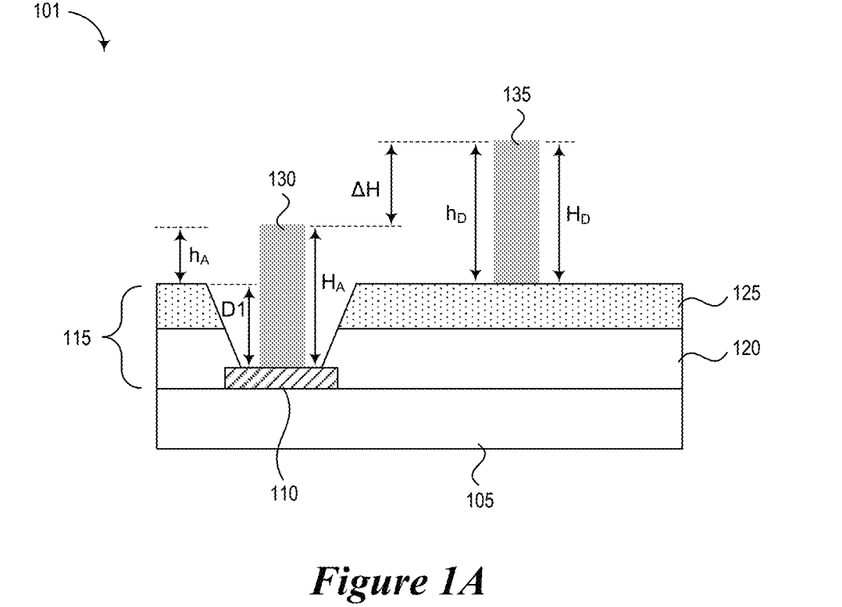
FIG. 1A and 1B are cross-sectional diagrams of semiconductor dies illustrating bump coplanarity for the semiconductor dies.

FIG. 1A is a cross-sectional diagram of a semiconductor die 101 illustrating coplanarity between active bumps and dummy bumps. The semiconductor die 101 of FIG. 1A includes a substrate 105 (e.g., silicon substrate) with various active components (e.g., functional features) of the semiconductor die 101—e.g., memory arrays, peripheral circuitry, integrated circuit components, etc. The semiconductor die 101 may include a plurality of bond pads (one of which is depicted as a bond pad 110) that are coupled to active components of the semiconductor die 101. Further, the semiconductor die 101 may include a passivation layer 115 to protect the active components and the bond pads. The passivation layer 115 may include a dielectric layer 120 and a polyimide layer 125 formed above the dielectric layer 120, in some embodiments. FIG. 1A illustrates that a portion of the passivation layer 115 is removed to form an opening that exposes a surface of the bond pad 110. The opening is depicted to have a depth D1 below a surface of the passivation layer 115.

Moreover, a bump 130 (which may be referred to as a pillar) may be formed on the exposed surface of the bond pad 110. The bump 130 may include a conductive metal (e.g., copper (Cu)), and the bump 130 may be referred to as an active bump 130 in view of the bond pad 110 being coupled to the active components of the semiconductor die 101. The bump 130 is depicted to have a total height $H_A$, and a height $h_A$ above the surface of the passivation layer 115. Further, the semiconductor die 101 may include a dummy bump 135 formed on the surface of the passivation layer 115. As such, the dummy bump 135 is isolated from the active components of the semiconductor die 100, and electrically floating. The dummy bump 135 is depicted to have a total height $H_D$, and a height hp above the surface of the passivation layer 115, which is same as $H_D$.

In some embodiments, total heights of the active and dummy bumps (e.g., $H_A$ and $H_D$) may be targeted to be different—e.g., by designing areal density of the dummy bumps to be different from that of the active bumps and/or by designing cross-section areas of the dummy bumps to be different from that of the active bumps. Unless noted otherwise, however, the active bump 130 and the dummy bump 135 may be regarded to have approximately the same structural dimensions (e.g., heights and/or widths) within statistical variations of the process technology—e.g., within 5% variation, within 10% variation, or the like, to illustrate clearly the principles of the present technology.

FIG. 1A illustrates a difference between $h_A$ and hp as ΔH, which may be referred to as coplanarity between the active bump 130 and the dummy bump 135—e.g., the smaller the difference ΔH between $h_A$ and hp, the better (improved, enhanced) coplanarity for forming semiconductor device assemblies—e.g., reduced probability of having smashed joints and/or non-joints during a flip-chip bonding process. In general, OH can be devised to be less than or equal to a predetermined value or within a certain range (e.g., the coplanarity requirements) such that the flip-chip bonding process may form interconnects (joints) without creating yield or reliability issues—e.g., due to smashed joints and/or non-joints. By way of example, ΔH may be less than five (5) micrometers (μm). In other examples, ΔH may be between five (5) to seven (7) μm. In yet another example, ΔH may be less than ten (10) μm.

Figure 1B:
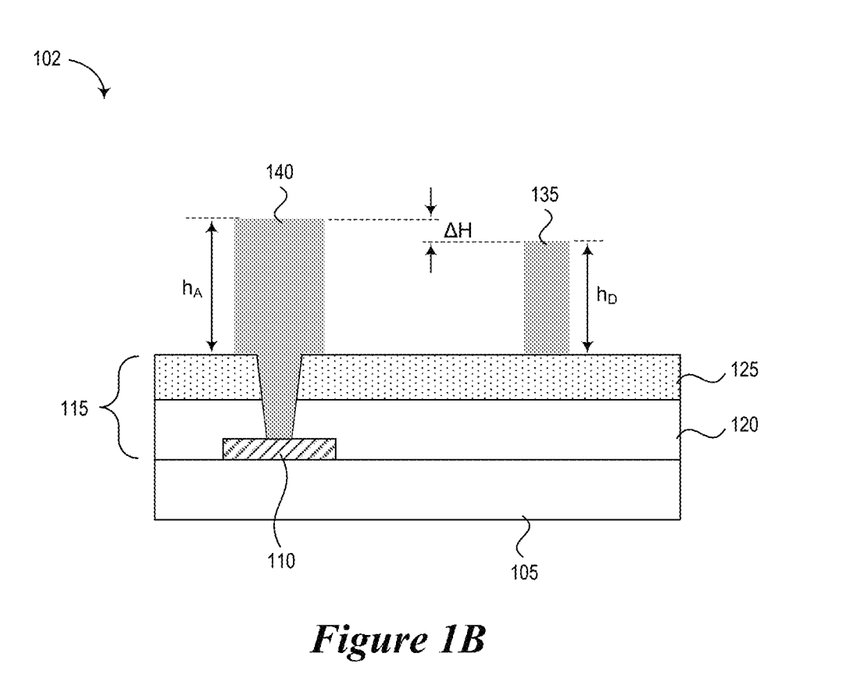

FIG. 1B is a cross-sectional diagram of a semiconductor die 102 illustrating coplanarity between active bumps and dummy bumps. The semiconductor die 102 may include aspects of the semiconductor die 101. For example, the semiconductor die 102 includes the substrate 105 with various active components of the semiconductor die 102 and a plurality of bond pads (one of which is depicted as the bond pad 110) that are coupled to the active components of the semiconductor die 102. Further, the semiconductor die 100 includes the passivation layer 115 with the dielectric layer 120 and the polyimide layer 125. FIG. 1B illustrates that a portion of the passivation layer 115 is removed to form an opening that exposes a surface of the bond pad 110. When compared to the semiconductor die 101 described with reference to FIG. 1A, the semiconductor die 102 includes an active bump 140 that fills the opening formed in the passivation layer 115 and extends above the surface of the passivation layer 115. Further, the active bump 140 includes a notched portion in contact with the surface of the passivation layer 115.

As described in more detail with reference to FIG. 3C, the bumps of semiconductor dies 101 and 102 may be formed utilizing an electro-plating process that forms an electrically conductive materials on surfaces uncovered by a photoresist. For example, the active bump 130 may correspond to a photoresist pattern (e.g., an opening in the photoresist) that is smaller than the opening in the passivation layer 115, in which the active bump 130 is formed. Accordingly, the active bump 130 forms (grows) from the bottom of the photoresist pattern during the electro-plating process.

Contrastingly, the active bump 140 may correspond to a photoresist pattern (e.g., an opening in the photoresist) that is larger than the opening in the passivation layer 115. As such, the active bump 140 may form (grow) not only from the bottom of the photoresist pattern but also from the sidewall (and/or the surface) of the passivation layer 115. In such cases, the active bump 140 may grow taller than the dummy bump 135 that grows from the bottom of the resist pattern—e.g., the height $h_A$ of the active bump 140 greater (taller) than the height hp of the dummy bump 135. Nonetheless, a difference ΔH between $h_A$ and hp may be referred to as coplanarity between the active bump 140 and the dummy bump 135, and the smaller the difference ΔH, the semiconductor die 102 is regarded to have the better (improved, enhanced) coplanarity for forming semiconductor device assemblies—e.g., reduced probability of having smashed joints and/or non-joints during a flip-chip bonding process.

Figure 2A:
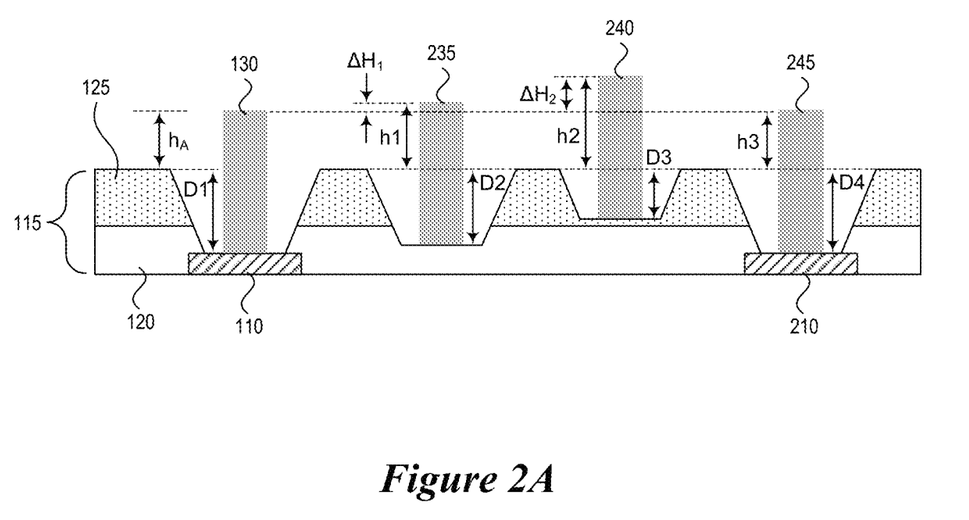
FIG. 2A and 2B are cross-sectional diagrams of semiconductor dies in accordance with embodiments of the present technology.

FIG. 2A is a cross-sectional diagram of a semiconductor die in accordance with embodiments of the present technology. The semiconductor die in FIG. 2A may include aspects of the semiconductor die 101 described with reference to FIG. 1A. For example, the semiconductor die includes the bond pad 110 and the active bump 130 coupled to the bond pad 110. The semiconductor die also includes the passivation layer 115 with the dielectric layer 120 and the polyimide layer 125. Further, the semiconductor die is illustrated to include another bond pad 210. The bond pad 210 may be coupled to a ground plane (or a ground node) of the semiconductor die. Further, the semiconductor die in FIG. 2A may include first, second, and third dummy bumps 235, 240, and 245. Unless noted otherwise, all the bumps (e.g., the active bump 130, the dummy bumps 235, 240, and 245) are regarded to have the same total height and width.

In some embodiments, the dielectric layer 120 may include composite layers of dielectric materials (e.g., oxide, nitride, oxynitride, etc.). In some cases, the dielectric layer 120 may include only inorganic dielectric layers (e.g., oxide, nitride, etc.) In some embodiments, the dielectric layer 120 may have been planarized (e.g., polished) to remove (or otherwise reduce) surface topography of the dielectric layer 120, which may be incurred by underlying bond pads 110 and 210, prior to forming the polyimide layer 125.

As shown in FIG. 2A, the active bump 130 is disposed in a first opening that extends from a surface of the passivation layer 115 to a surface of the bond pad 110. The first opening may have a depth D1 from the surface of the passivation layer 115. Further, the active bump 130 may have a height $h_A$ above the surface of the passivation layer 115.

FIG. 2A illustrates the first dummy bump 235 disposed in a second opening that extends from the surface of the passivation layer 115 past the polyimide layer 125. The second opening may have a depth D2 from the surface of the passivation layer 115. Further, the first dummy bump 235 is depicted to have a height h1 above the surface of the passivation layer 115, which is less than the full height of the first dummy bump 235. As depicted in FIG. 2A, the depth D2 may be less than the depth D1, and thus the height h1 may be greater than the height $h_A$. In comparison to the dummy bump 135 depicted in FIG. 1A, the first dummy bump 235 is located at a recessed surface of the second opening from the surface of the passivation layer 115. In this manner, the difference ($\Delta H_1$) between $h_A$ and h1 is less than ΔH described with reference to FIG. 1, and the first dummy bump 235 provides an improved coplanarity with respect to the active bump 130—e.g., to reduce probability of having smashed joints and/or non-joints during the flip-chip bonding process. In some embodiments, the difference ($\Delta H_1$) between $h_A$ and h1 can be greater than or equal to five (5) micrometers and less than or equal to seven (7) micrometers.

Although, the depth D2 of the second opening is described and illustrated to be less than the depth D1 in FIG. 2A, the present technology is not limited thereto. For example, the depth D2 may be targeted to be approximately the same as the depth D1 within statistical process variations. In another example, the depth D2 may be targeted to be greater than the depth D1 so long as the difference between $h_A$ and h1 ($\Delta H_1$) is less than a predetermined value (e.g., the criteria for coplanarity).

Moreover, FIG. 2A illustrates the second dummy bump 240 disposed in a third opening that extends from the surface of the passivation layer 115 toward the dielectric layer 120, without extending past the polyimide layer 125. The second opening may have a depth D3 from the surface of the passivation layer 115. Further, the second dummy bump 240 is depicted to have a height h2 above the surface of the passivation layer 115, which is less than the full height of the second dummy bump 240. As depicted in FIG. 2A, the depth D3 may be less than the depths D1 and/or D2, and thus the height h2 may be greater than the height $h_A$ and/or h1. In comparison to the dummy bump 135 depicted in FIG. 1A, the second dummy bump 240 is located at a recessed surface of the third opening from the surface of the passivation layer 115. In this manner, the difference ($\Delta H_2$) between $h_A$ and h2 is less than ΔH described with reference to FIG. 1, and the second dummy bump 240 disposed in the third opening with a recessed surface from the surface of the passivation layer 115 provides an improved coplanarity with respect to the active bump 130—e.g., to reduce probability of having smashed joints and/or non-joints during the flip-chip bonding process.

If the difference ($\Delta H_2$) between $h_A$ and h2 is inadequate—e.g., greater than the predetermined value (e.g., the criteria for the coplanarity), design parameters for the second dummy bump 240 may be altered to reduce the total height of the second dummy bump 240 to decrease h2, the height above the surface of the passivation layer 115. For example, a cross-sectional area of the second dummy bump 240 may be increased (e.g., greater than that of the active bump 130 and/or the first dummy bump 235) such that the second dummy bump 240 can grow shorter, during the electroplating process described with reference to FIG. 3C, than the active bump 130 and/or the first dummy bump 235—e.g., the second dummy bump 240 may have a shorter total height than the active bump 130 and/or the first dummy bump 235. Additionally, or alternatively, if the second dummy bump 240 is included in a plurality of second dummy bump 240 with an areal density, the areal density of the plurality of second dummy bump 240 may be increased such that individual second dummy bump 240 may grow shorter than the active bump 130 and/or the first dummy bump 235. In this manner, the difference ($\Delta H_2$) between $h_A$ and h2 may be reduced such that $\Delta H_2$ can be less than or equal to the predetermined value—e.g., meeting the criteria for coplanarity.

Further, FIG. 2A illustrates the third dummy bump 245 disposed in a fourth opening that extends from the surface of the passivation layer 115 to a surface of the bond pad 210. The fourth opening may have a depth D4 from the surface of the passivation layer 115. Further, the third dummy bump 245 is depicted to have a height h3 above the surface of the passivation layer 115. In some embodiments, the depth D4 of the fourth opening may be the same as the depth D1 (e.g., within statistical process variations). Thus, the difference between $h_A$ and h3 may be negligible (e.g., within statistical process variations) providing a nearly ideal coplanarity situation. As the third dummy bump 245 is coupled to the bond pad 210, the third dummy bump 245 is connected to the ground plane (or a ground node) of the semiconductor die because the bond pad 210 may be coupled to the ground plane as described above.

In some embodiments, the surface of the bond pad 210 may provide a stopping surface (e.g., when compared to the second opening that terminates within the dielectric layer 120) during the process removing the dielectric layer 120 as described with reference to FIG. 3B. Such a stopping surface may provide an improved process control (e.g., depths of the openings with the stopping surface may be more uniform when compared to those of openings without the stopping surface). The semiconductor die, however, may have restrictions as to placing a quantity of the bond pads (e.g., the ground bond pads 210) in various places, such as through-substrate vias (TSVs) that may be incompatible with the ground bond pads, an industry standard specification (e.g., Joint Electron Device Engineering Council (JEDEC)) prohibiting placements of the ground bond pads in certain locations, or the like.

Figure 2B:
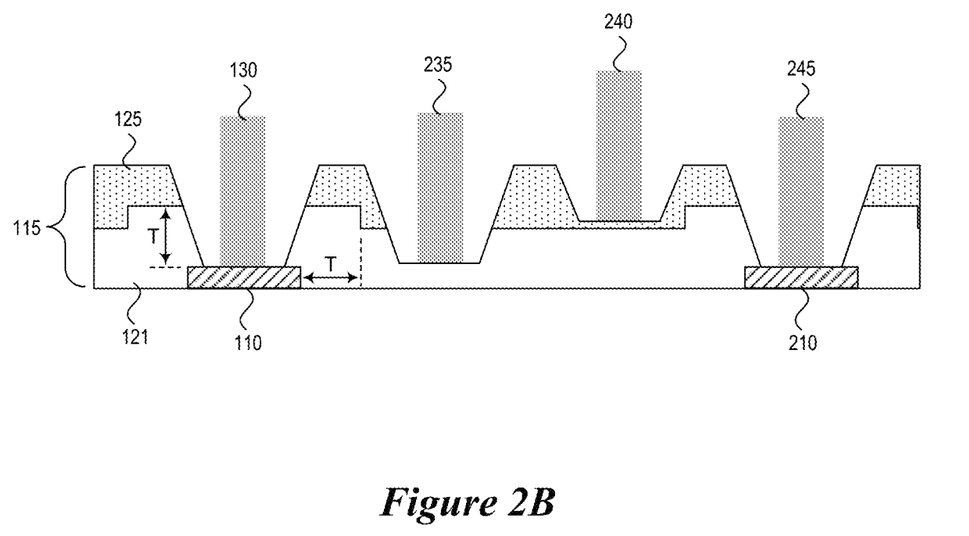

FIG. 2B is a cross-sectional diagram of a semiconductor die in accordance with embodiments of the present technology. The semiconductor die in FIG. 2B may include aspects of the semiconductor die 101 described with reference to FIG. 1 and/or the semiconductor die described with reference to FIG. 2A. For example, the semiconductor die of FIG. 2B includes the bond pad 110 and the active bump 130 coupled to the bond pad 110. The semiconductor die also includes the passivation layer 115 including the polyimide layer 125. Further, the semiconductor die is illustrated to include the bond pad 210 coupled to a ground node of the semiconductor die. Further, the semiconductor die in FIG. 2B includes first, second, and third dummy bumps 235, 240, and 245.

When compared to the semiconductor die described with reference to FIG. 2A, the passivation layer 115 includes a dielectric layer 121 that is conformal to the bond pads 110 and 210. The dielectric layer 121 has a uniform thickness (denoted as "T" in FIG. 2B) on the surface and a sidewall of the bond pads 110 and 210. In some embodiments, the dielectric layer 121 includes a single dielectric layer. As described with reference to FIG. 2A, the dummy bumps 235, 240, and 245 provide improved coplanarity with respect to the active bump 130—e.g., to reduce probability of having smashed joints and/or non-joints during the flip-chip bonding process. As such, the present technology can be applied to semiconductor dies having a planarized dielectric layer (e.g., the dielectric layer 120) and/or semiconductor dies having a conformal dielectric layer (e.g., the dielectric layer 121) to improve coplanarity of the bumps.

Figure 3A:
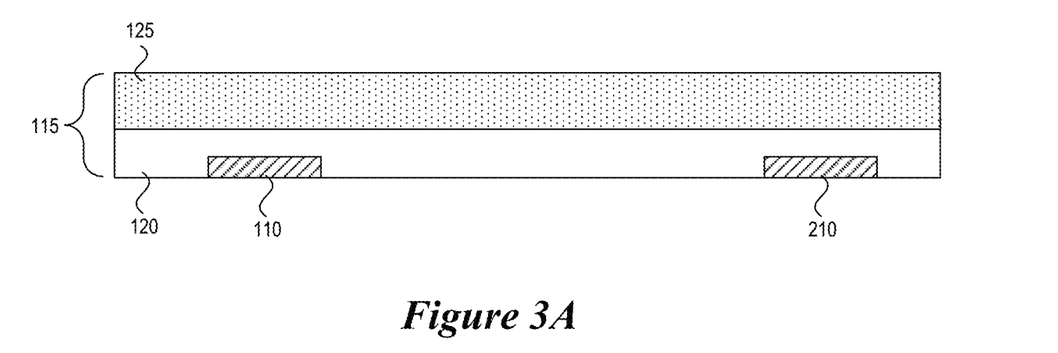
FIGS. 3A through 3D illustrate stages of a process for forming bumps in accordance with an embodiment of the present technology.

FIGS. 3A through 3D illustrate stages of a process for forming bumps with improved coplanarity in accordance with an embodiment of the present technology. The semiconductor die depicted in FIGS. 3A through 3D may include aspects of the semiconductor die 101 described with reference to FIG. 1A and/or the semiconductor die described with reference to FIG. 2A. For example, FIG. 3A illustrates the semiconductor die including the bond pads 110 and 210, and the passivation layer 115 with the dielectric layer 120 and the polyimide layer 125. As described above, the dielectric layer 120 formed over the bond pads 110 and 210 may have been planarized prior to forming the polyimide layer 125.

Figure 3B:
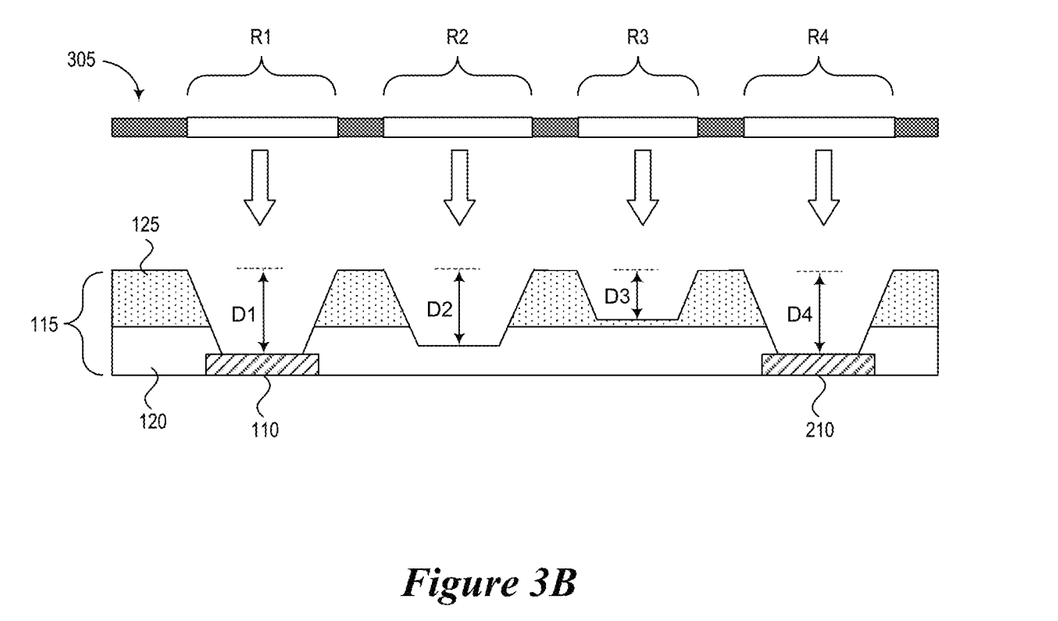

FIG. 3B illustrates a cross-section diagram of the semiconductor die including first through fourth openings formed in the passivation layer 115. In this regard, the semiconductor die depicted in FIG. 3A may have been exposed with a reticle 305 that includes first through fourth regions R1 through R4 that correspond to the first through fourth openings, respectively. The first region of the reticle may be configured for a full exposure—e.g., 100% exposure. The second region of the reticle may be configured for a first partial exposure—e.g., 80% exposure. Similarly, the third region of the reticle may be configured for a second partial exposure that is less than the first partial exposure—e.g., 50% exposure. The fourth region of the reticle may be configured for the full exposure—e.g., 100% exposure.

In this manner, the first partial exposure associated with the second region R2 allows a first degree of electromagnetic energy penetration (indicated as the downward arrow below the second region R2) through the reticle 305 during the exposure process. Similarly, the second partial exposure associated with the third region R3 allows a second degree of electromagnetic energy penetration (indicated as the downward arrow below the third region R3) through the reticle 305 during the exposure process, the second degree of electromagnetic energy penetration being less than the first degree of electromagnetic energy penetration. Further, the second region R2 of the reticle 305 may include a first partially opaque material configured for the first degree of electromagnetic energy penetration and the third region R3 of the reticle 305 may include a second partially opaque material configured for the second degree of electromagnetic energy penetration. In some cases, the reticle 305 may be referred to include a leaky chrome, in view of the partially opaque material (e.g., chrome) configured for partial exposure of an underlying layer. As such, the photolithography processing utilizing the reticle 305 including a leak chrome may be referred to as a leaky chrome process.

Subsequently, the exposed polyimide layer 125 may be developed such that the passivation layer 115 can have the first opening corresponding to the first region R1, the second opening corresponding to the second region R2, the third opening corresponding to the third region R3, and the fourth opening corresponding to the fourth region R4. Further, developing the exposed polyimide layer may include removing at least a portion of the dielectric layer 120 below the exposed polyimide layer 125—e.g., utilizing a dry etch process. In some embodiments, forming the openings in the passivation layer 115 may be accomplished by at least two separate process steps—e.g., developing the exposed polyimide layer (e.g., in an aqueous organic developer), followed by a dry etch process. In this regard, different degrees of electromagnetic energy received at the polyimide layer 125 using the leaky chrome process may result in different thicknesses of remaining polyimide layer in different regions after the exposed polyimide layer has been developed. The remaining polyimide layers can at least partially block the subsequent dry etch process (until fully consumed by the dry etch) such that the depth of openings may vary. As such, the amount of the dielectric layer 120 removed may be related to (e.g., proportional to) the electromagnetic energy penetrated through the reticle 305 during the exposure process.

The first (and the fourth) opening corresponding to the first region R1 (and the fourth region R4) configured for the full exposure may extend from the surface of the polyimide layer 115 to the surface of the bond pads (e.g., bond pad 110, bond pad 210)—e.g., the first region R1 does not have a remaining polyimide layer and the dry etch process is devised to remove the dielectric layer 120 above the bond pads 110. The second opening corresponding to the second region R2 (e.g., configured for the first partial exposure of 80%) may extend from the surface of the polyimide layer 115 partially into the dielectric layer 120—e.g., the second region R2 has 20% of the polyimide layer remaining and the dry etch process is partially blocked until the 20% of the polyimide layer is consumed by the dry etch process. Similarly, the third opening corresponding to the third region R3 (e.g., configured for the second partial exposure of 50%) may extend from the surface of the polyimide layer 115 toward the dielectric layer 120, without extending past the polyimide layer 125—e.g., the third region R3 has 50% of the polyimide layer remaining and the dry etch process is completely blocked without fully consuming the 50% of the polyimide layer remaining. Accordingly, the first opening is depicted to have a depth D1, which may be same as the depth D4 of the fourth opening (e.g., within statistical process variations). The second opening is depicted to have a depth D2 less than D1 (and/or D4). Similarly, the third opening has a depth D3 less than D2.

Figure 3C:
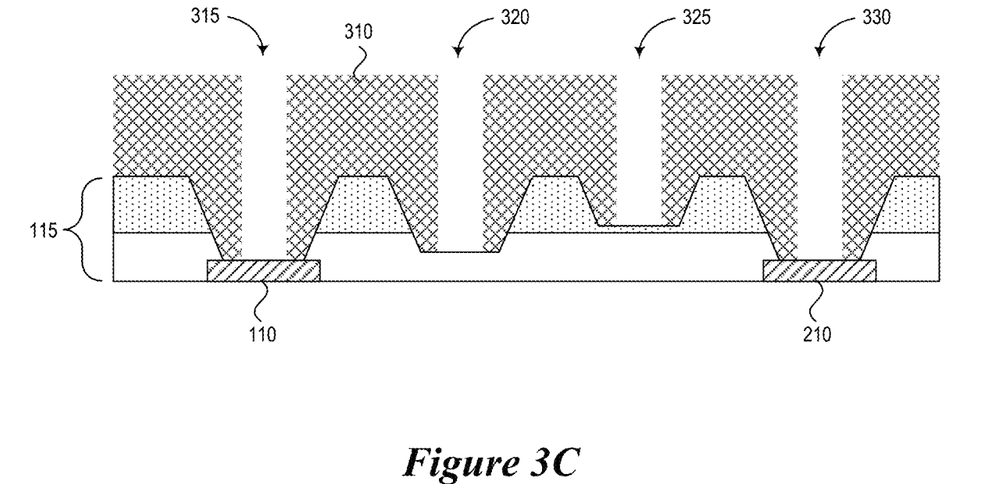

FIG. 3C illustrates a cross-section diagram of the semiconductor die including first through fourth patterns 315, 320, 325, and 330 formed in a photoresist 310. In this regard, the photoresist 310 may have been dispensed on the semiconductor die depicted in FIG. 3B. Subsequently, the first through fourth patterns 315, 320, 325, and 330 may be formed on the photoresist 310 using a photolithography process known to one skilled in the art.

Figure 3D:
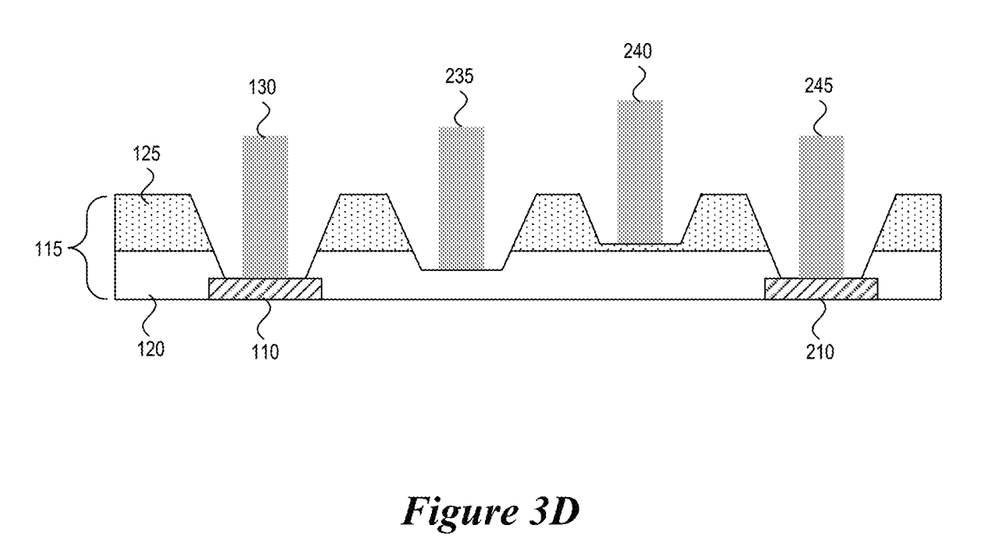

FIG. 3D illustrates a cross-section diagram of the semiconductor die including the active bump 130, the first through third dummy bumps 235, 240, and 245 formed in the first through fourth openings, respectively. In this regard, an electroplating process may have been performed on the semiconductor die depicted in FIG. 3C. For example, a plating process (e.g., Cu-plating process) may be performed using a plating solution that deposits metallic material (e.g., copper) over the surfaces exposed to the plating solution (e.g., surfaces not covered by the photoresist 310)—e.g., concurrently forming the active bump 130 and the first through third dummy bumps 235, 240, and 245. In some embodiments, total heights of the individual bumps are approximately equal (e.g., within statistical process variations).

In some embodiments, total heights of the individual bumps may be modified by varying an areal density of the bumps (or other structural dimensions of the bumps, e.g., cross-sectional areas of the bumps). The areal density may correspond to a percentage of area occupied by the bumps within a unit area, which may influence the metal deposition rate during the electroplating process. For example, the semiconductor die of FIG. 3D may include a plurality of first dummy bumps, one of which is depicted as the first dummy bump 235. Further, the semiconductor die of FIG. 3D may also include a plurality of second dummy bumps, one of which is depicted as the second dummy bump 240. In some embodiments, the areal density of the second dummy bumps may be designed to be greater than that of the first dummy bumps. As a result, heights of the second dummy bumps (e.g., the second dummy bump 240) may be less than the heights of the first dummy bumps (e.g., the first dummy bump 235). In this manner, if the coplanarity between the active bump 130 and the second dummy bump 240 as shown in FIG. 3D is inadequate (e.g., greater than the criteria for the coplanarity), the total heights of the second dummy bump 240 may be reduced to improve the coplanarity.

Figure 4:
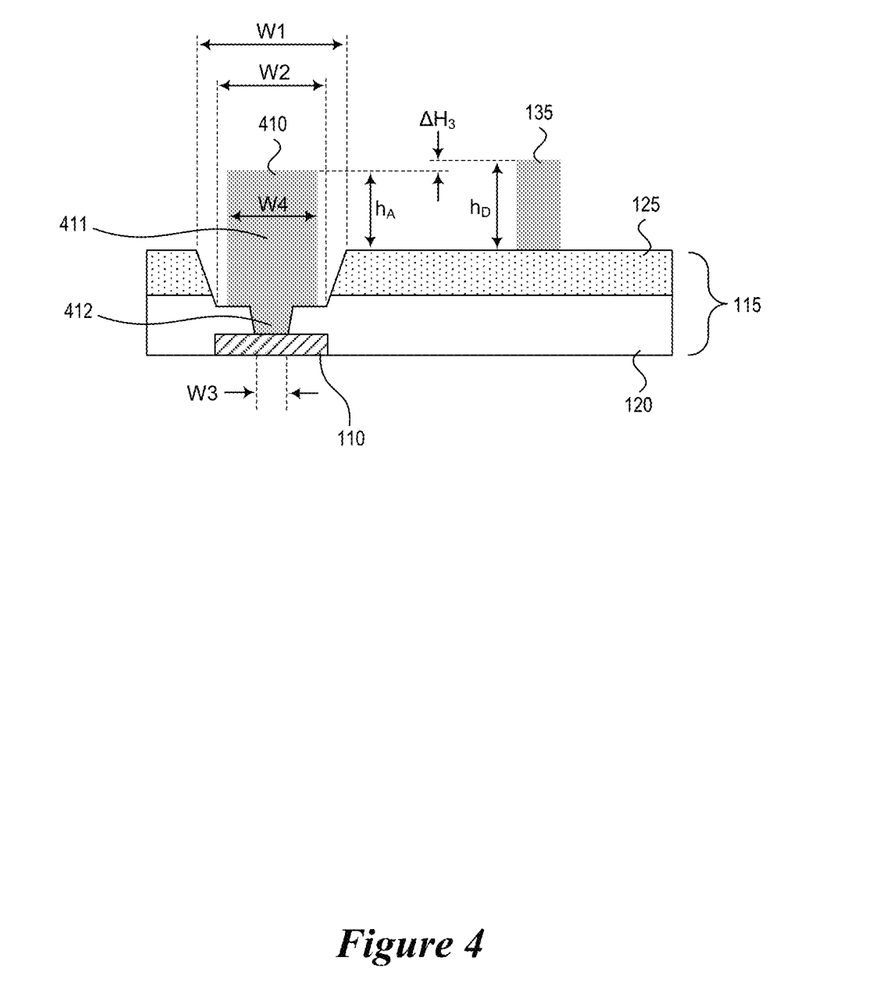
FIG. 4 is a cross-sectional diagram of a semiconductor die in accordance with an embodiment of the present technology.

FIG. 4 is a cross-sectional diagram of a semiconductor die in accordance with an embodiment of the present technology. The semiconductor die of FIG. 4 may include aspects of the semiconductor die 102 described with reference to FIG. 1B. For example, the semiconductor die includes the bond pad 110 and the passivation layer 115 with the dielectric layer 120 and the polyimide layer 125. When compared to the semiconductor die 102 of FIG. 1B, the semiconductor die of FIG. 4 includes an active bump 410 disposed in an opening extending from the surface of the passivation layer 115 to a surface of the bond pad 110. In this manner, the active bump 410 is disposed on a recessed surface of the opening such that the coplanarity (e.g., the difference $\Delta H_3$ between the height $h_A$ of the active bump 410 above the surface of the passivation layer 115 and the height $h_D$ of the dummy bump 135) is improved when compared to the coplanarity described with reference to FIG. 1B—e.g., $\Delta H$ between the active bump 140 and the dummy bump 135.

The opening depicted in FIG. 4, in which the active bump 410 is disposed, may be formed by a process similar to the process illustrated and described with reference to FIGS. 3A through 3D. In this regard, the opening has a first width (denoted as W1) at the surface of the passivation layer, a second width (denoted as W2) smaller than the first width at a notched portion past the polyimide layer 125 (e.g., the notched portion of the opening is within the dielectric layer 120), and a third width (denoted as W3) smaller than the second width at the surface of the bond pad. Further, the active bump 410 may include a first portion 411 having a fourth width (denoted as W4) less than the second width (W2) of the opening, where the first portion 411 is located above the notched portion of the opening. The active bump 410 may also include a second portion 412 that fills the opening below the notched portion.

Figure 5:
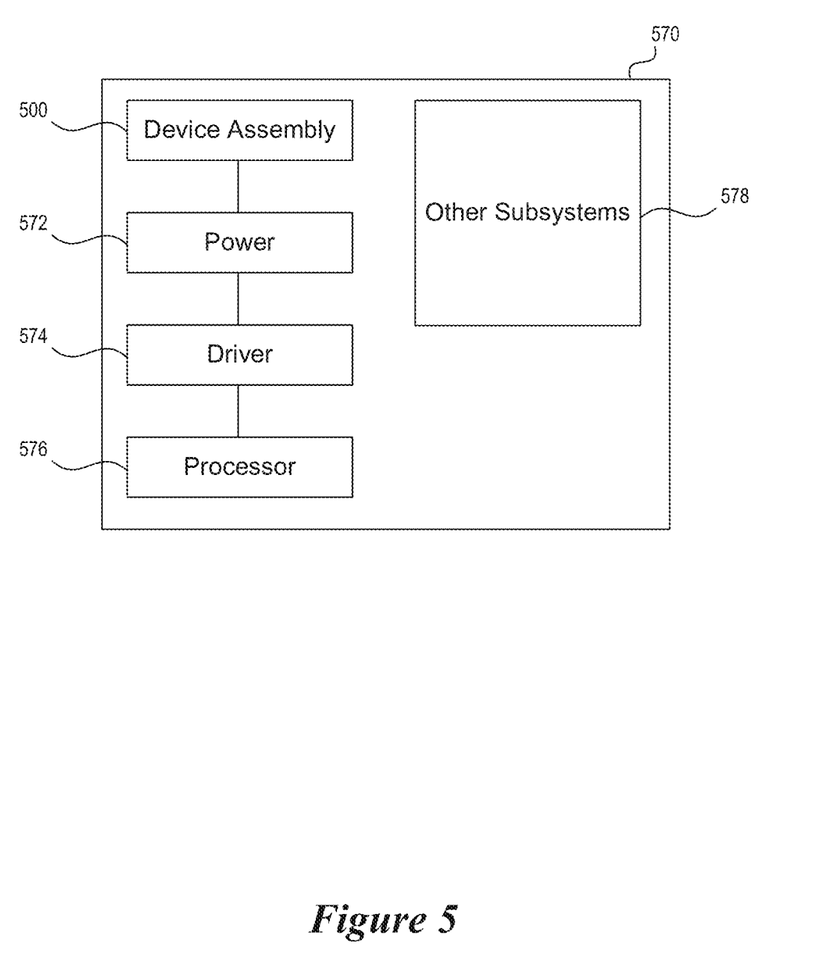
FIG. 5 is a block diagram schematically illustrating a system including a semiconductor device assembly configured in accordance with an embodiment of the present technology.

The semiconductor die described with reference to FIGS. 2A through 4 may be included in a semiconductor device assembly 500, which can be incorporated into any of a myriad of larger and/or more complex systems, a representative example of which is the system 570 shown schematically in FIG. 5. The system 570 can include a semiconductor device assembly 500, a power source 572, a driver 574, a processor 576, and/or other subsystems or components 578. The semiconductor device assembly 500 can include features generally similar to those of the active bumps and dummy bumps (e.g., dummy bumps disposed at the recessed surface of the passivation layer) having coplanarity within a tolerable limit as described herein (e.g., the predetermined value, the criteria for coplanarity), and can therefore mitigate various issues that may limit yield and/or reliability performance of the semiconductor device assembly 500—e.g., due to non-joints and/or smashed joints. The resulting system 570 can perform any of a wide variety of functions, such as memory storage, data processing, and/or other suitable functions. Accordingly, representative systems 570 can include, without limitation, hand-held devices (e.g., mobile phones, tablets, digital readers, and digital audio players), computers, and appliances. Components of the system 570 may be housed in a single unit or distributed over multiple, interconnected units (e.g., through a communications network). The components of the system 570 can also include remote devices and any of a wide variety of computer readable media.

Figure 6:
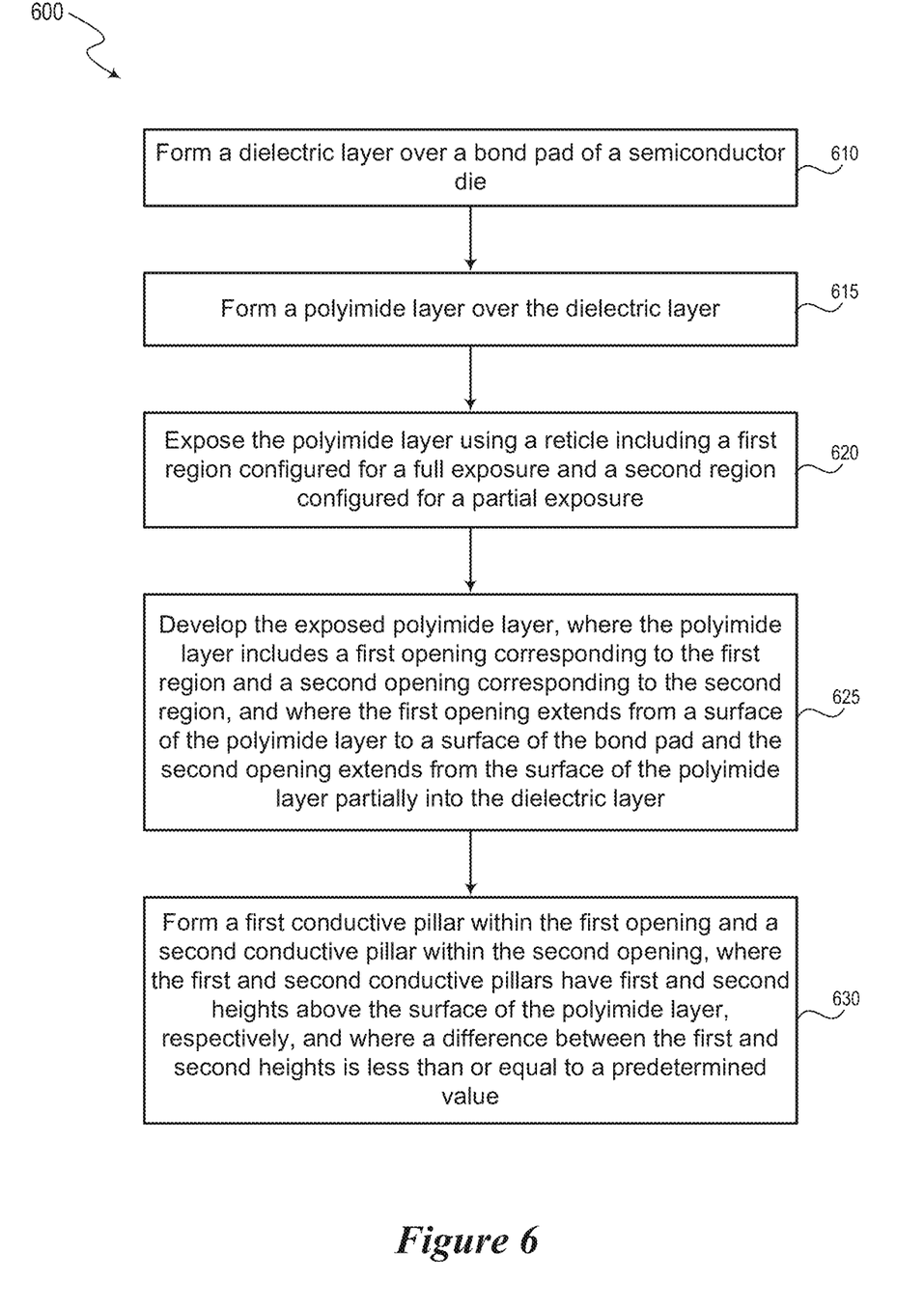
FIG. 6 is a flowchart of a method of forming bumps with improved coplanarity for semiconductor dies in accordance with embodiments of the present technology.

FIG. 6 is a flowchart 600 illustrating a method of forming bumps with improved coplanarity for semiconductor dies in accordance with embodiments of the present technology. The flowchart 600 may include aspects of methods as described with reference to FIGS. 2A through 4.

The method includes forming a dielectric layer over a bond pad of a semiconductor die (box 610). The method further includes forming a polyimide layer over the dielectric layer (box 615). The method further includes exposing the polyimide layer using a reticle including a first region configured for a full exposure and a second region configured for a partial exposure (box 620). The method further includes developing the exposed polyimide layer, where the polyimide layer includes a first opening corresponding to the first region and a second opening corresponding to the second region, and where the first opening extends from a surface of the polyimide layer to a surface of the bond pad and the second opening extends from the surface of the polyimide layer partially into the dielectric layer (box 625). The method further includes concurrently forming a first conductive pillar within the first opening and a second conductive pillar within the second opening, where the first and second conductive pillars have first and second heights above the surface of the polyimide layer, respectively, and where a difference between the first and second heights is less than or equal to a predetermined value (box 630).

In some embodiments, developing the exposed polyimide layer includes removing at least a portion of the dielectric layer below the exposed polyimide layer. In some embodiments, concurrently forming the first and second conductive pillars includes dispensing a photoresist on the polyimide layer having the first and second openings, forming, on the photoresist, a first pattern corresponding to the first conductive pillar and a second pattern corresponding to the second conductive pillar, and electro-plating a conductive material in the first and second patterns.

In some embodiments, the partial exposure associated with the second region is a first partial exposure corresponding to a first degree of electromagnetic energy penetration through the reticle, where the reticle includes a third region configured for a second partial exposure corresponding to a second degree of electromagnetic energy penetration that is less than the first degree of electromagnetic energy penetration, a third opening forms on the polyimide layer as a result of exposing and developing the polyimide layer, the third opening corresponding to the third region, and the third opening extends from the surface of the polyimide layer toward the dielectric layer, without extending past the polyimide layer.

In some embodiments, the method may further include forming a third conductive pillar concurrently with the first and second conductive pillars, wherein the third conductive pillar has a third height above the surface of the polyimide layer, and wherein a difference between the first and third heights is less than or equal to the predetermined value. In some embodiments, the second region of the reticle includes a first partially opaque material configured for the first degree of electromagnetic energy penetration and the third region of the reticle includes a second partially opaque material configured for the second degree of electromagnetic energy penetration. In some embodiments, the method may further include planarizing the dielectric layer prior to forming the polyimide layer.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the technology have been described herein for purposes of illustration, but that various modifications may be made without deviating from the disclosure. For example, although the recessed openings formed in the passivation layer have been described as singular discrete openings as shown in the cross-sectional diagrams of FIGS. 2A through 4, various embodiments of the openings can be configured. For example, the recessed openings may include a footprint that is one of a rectangle, a circle, or an ellipse. In addition, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die, comprising:
 a passivation layer including a dielectric layer over a bond pad and a polyimide layer over the dielectric layer;
 a first opening in the passivation layer, the first opening extending from a surface of the passivation layer to a surface of the bond pad;
 a first conductive pillar disposed within the first opening, the first conductive pillar connected to the bond pad and having a first height above the surface of the passivation layer;
 a second opening in the passivation layer, the second opening extending from the surface of the passivation layer past the polyimide layer; and
 a second conductive pillar disposed within the second opening, the second conductive pillar having a second height above the surface of the passivation layer, wherein a difference between the first and second heights is less than or equal to a predetermined value.

2. The semiconductor die of claim 1, wherein the predetermined value is greater than or equal to five (5) and less than or equal to seven (7) micrometers.

3. The semiconductor die of claim 1, wherein:
the first opening has a first depth; and
the second opening has a second depth less than the first depth.

4. The semiconductor die of claim 1, wherein the first and second openings are concurrently formed.

5. The semiconductor die of claim 1, further comprising:
a third opening in the passivation layer, the third opening extending from the surface of the passivation layer toward the dielectric layer, without extending past the polyimide layer; and
a third conductive pillar disposed within the third opening, the third conductive pillar having a third height above the surface of the passivation layer, wherein a difference between the first and third heights is less than or equal to the predetermined value.

6. The semiconductor die of claim 5, wherein:
the second conductive pillar is included in a plurality of second conductive pillars that each have a second total height;
the third conductive pillar is included in a plurality of third conductive pillar that each have a third total height less than the second total height; and
an areal density of the plurality of second conductive pillars is less than that of the plurality of third conductive pillars.

7. The semiconductor die of claim 1, wherein the bond pad is a first bond pad coupled to an active component of the semiconductor die, and the semiconductor die further includes:
a second bond pad coupled to a ground plane of the semiconductor die, wherein the second conductive pillar is connected to the second bond pad.

8. The semiconductor die of claim 1, wherein the dielectric layer includes two or more dielectric materials and is planarized prior to depositing the polyimide layer over the planarized dielectric layer.

9. The semiconductor die of claim 1, wherein the dielectric layer includes a single dielectric material with a uniform thickness on the surface and a sidewall of the bond pad.

10. The semiconductor die of claim 1, wherein the second opening includes a footprint that is one of a rectangle, a circle, or an ellipse.

11. A semiconductor die, comprising:
a passivation layer including a dielectric layer over a bond pad and a polyimide layer over the dielectric layer;
an opening in the passivation layer extending from a surface of the passivation layer to a surface of the bond pad, wherein the opening has a first width at the surface of the passivation layer, a second width smaller than the first width at a notched portion past the polyimide layer, and a third width smaller than the second width at the surface of the bond pad;
a first conductive pillar disposed within the opening, the first conductive pillar connected to the bond pad and having a first height above the surface of the passivation layer; and
a second conductive pillar disposed on the surface of the passivation layer, the second conductive pillar having a second height, wherein a difference between the first and second heights is less than or equal to a predetermined value.

12. The semiconductor die of claim 11, wherein the first conductive pillar includes a first portion having a fourth width less than the second width, the first portion above the notched portion.

13. The semiconductor die of claim 12, wherein the first conductive pillar includes a second portion that fills the opening below the notched portion.

14. A method, comprising:
forming a dielectric layer over a bond pad of a semiconductor die;
forming a polyimide layer over the dielectric layer;
exposing the polyimide layer using a reticle including a first region configured for a full exposure and a second region configured for a partial exposure;
developing the exposed polyimide layer, wherein the polyimide layer includes a first opening corresponding to the first region and a second opening corresponding to the second region, and wherein the first opening extends from a surface of the polyimide layer to a surface of the bond pad and the second opening extends from the surface of the polyimide layer partially into the dielectric layer; and
concurrently forming a first conductive pillar within the first opening and a second conductive pillar within the second opening, wherein the first and second conductive pillars have first and second heights above the surface of the polyimide layer, respectively, and wherein a difference between the first and second heights is less than or equal to a predetermined value.

15. The method of claim 14, wherein developing the exposed polyimide layer includes removing at least a portion of the dielectric layer below the exposed polyimide layer.

16. The method of claim 14, wherein concurrently forming the first and second conductive pillars includes:
dispensing a photoresist on the polyimide layer having the first and second openings;
forming, on the photoresist, a first pattern corresponding to the first conductive pillar and a second pattern corresponding to the second conductive pillar; and
electro-plating a conductive material in the first and second patterns.

17. The method of claim 14, wherein the partial exposure associated with the second region is a first partial exposure corresponding to a first degree of electromagnetic energy penetration through the reticle, and wherein:
the reticle includes a third region configured for a second partial exposure corresponding to a second degree of electromagnetic energy penetration that is less than the first degree of electromagnetic energy penetration;
a third opening forms on the polyimide layer as a result of exposing and developing the polyimide layer, the third opening corresponding to the third region; and
the third opening extends from the surface of the polyimide layer toward the dielectric layer, without extending past the polyimide layer.

18. The method of claim 17, further comprising:
forming a third conductive pillar concurrently with the first and second conductive pillars, wherein the third conductive pillar has a third height above the surface of the polyimide layer, and wherein a difference between the first and third heights is less than or equal to the predetermined value.

19. The method of claim 17, wherein the second region of the reticle includes a first partially opaque material configured for the first degree of electromagnetic energy penetration and the third region of the reticle includes a second partially opaque material configured for the second degree of electromagnetic energy penetration.

20. The method of claim 17, further comprising:
   planarizing the dielectric layer prior to forming the polyimide layer.

* * * * *